US008838187B2

(12) United States Patent
Zhao et al.

(10) Patent No.: US 8,838,187 B2
(45) Date of Patent: Sep. 16, 2014

(54) DETECTING CIRCUIT FOR ELECTRIC QUANTITY, PROCESSING DEVICE AND METHOD FOR STATE DETECTION OF MOBILE TELEPHONE IN STANDBY

(75) Inventors: Jinkai Zhao, Shenzhen (CN); Zhongwei Ji, Shenzhen (CN)

(73) Assignee: ZTE Corporation, Shenzhen (CN)

( * ) Notice: Subject to any disclaimer, the term of this patent is extended or adjusted under 35 U.S.C. 154(b) by 341 days.

(21) Appl. No.: 13/257,937

(22) PCT Filed: Dec. 21, 2009

(86) PCT No.: PCT/CN2009/075766
§ 371 (c)(1),
(2), (4) Date: Feb. 7, 2012

(87) PCT Pub. No.: WO2011/017879
PCT Pub. Date: Feb. 17, 2011

(65) Prior Publication Data

US 2012/0129578 A1 May 24, 2012

(30) Foreign Application Priority Data

Aug. 12, 2009 (CN) .......................... 2009 1 0165628

(51) Int. Cl.

| | |
|---|---|
| ***H04B 1/00*** | (2006.01) |
| ***C01D 7/37*** | (2006.01) |
| ***G01R 31/36*** | (2006.01) |
| *G01R 19/165* | (2006.01) |

(52) U.S. Cl.
CPC ...... *G01R 31/3606* (2013.01); *G01R 19/16542* (2013.01)
USPC ............................ 455/574; 455/572; 423/427

(58) Field of Classification Search
CPC ............ H04M 1/00; H04M 3/00; H04B 1/38; H04B 1/16; G01R 19/16542; G01R 19/00; G01R 31/3606; G01N 27/416; H04W 52/02; H02J 7/00; H04Q 1/30
USPC ................ 455/343.1–343.5, 418–420, 550.1, 455/556.2, 571–574, 127.5; 320/132, 320/134–136, 127, 150, 157, 159, 161–162, 320/164; 324/427–429, 432–433, 435, 431; 340/7.32–7.33, 7.36–7.37; 323/243
See application file for complete search history.

(56) References Cited

U.S. PATENT DOCUMENTS 4,225,792 A * 9/1980 Fahey ............................ 307/66
5,610,525 A * 3/1997 Yoshida et al. ............... 324/433

(Continued)

FOREIGN PATENT DOCUMENTS

CN 2228237 Y 5/1996
CN 1410779 A 4/2003

(Continued)

OTHER PUBLICATIONS

International Search Report in international application No. PCT/CN2009/075766, mailed on May 20, 2010.

(Continued)

*Primary Examiner* — Meless Zewdu
(74) *Attorney, Agent, or Firm* — Oppedahl Patent Law Firm LLC

(57) ABSTRACT

The present disclosure provides a processing method for detecting a state of a mobile telephone in standby, the method includes: determining whether a battery electric quantity of the mobile telephone in standby is high or low according to an electric quantity detecting circuit; determining a work state of a Modem module when the battery electric quantity of the mobile telephone is high; and determining a wakeup subsequent flow according to the determined battery electric quantity of the mobile telephone and the determined work state of the Modem module. The present disclosure further provides an electric quantity detecting circuit and a processing device for state detection of a mobile telephone in standby.

10 Claims, 2 Drawing Sheets

(56) References Cited

U.S. PATENT DOCUMENTS

| | | | | |
|---|---|---|---|---|
| 5,790,391 | A * | 8/1998 | Stich et al. | 363/24 |
| 6,242,890 | B1 * | 6/2001 | Sudo et al. | 320/128 |
| 6,304,088 | B1 * | 10/2001 | Yee | 324/433 |
| 6,363,146 | B1 * | 3/2002 | Aranovich et al. | 379/422 |
| 6,405,062 | B1 * | 6/2002 | Izaki | 455/573 |
| 6,789,026 | B2 | 9/2004 | Barsoukov | |
| 7,024,321 | B1 | 4/2006 | Deninger et al. | |
| 7,215,999 | B1 | 5/2007 | Shahandeh et al. | |
| 2004/0046673 | A1 * | 3/2004 | Kovarik et al. | 340/636.1 |
| 2004/0082363 | A1 * | 4/2004 | Hosein | 455/560 |
| 2004/0128086 | A1 * | 7/2004 | Barsoukov et al. | 702/63 |
| 2006/0069931 | A1 * | 3/2006 | Shin et al. | 713/300 |
| 2006/0117194 | A1 * | 6/2006 | Nishida | 713/300 |
| 2006/0238203 | A1 | 10/2006 | Kelley et al. | |
| 2007/0096679 | A1 | 5/2007 | Kim et al. | |
| 2007/0096697 | A1 | 5/2007 | Maireanu | |
| 2008/0018306 | A1 * | 1/2008 | Shin et al. | 320/149 |
| 2008/0054907 | A1 | 3/2008 | Kudo et al. | |
| 2009/0037124 | A1 | 2/2009 | Majima | |
| 2010/0004885 | A1 | 1/2010 | Nakanishi | |

FOREIGN PATENT DOCUMENTS

| | | | | |
|---|---|---|---|---|
| CN | 1584620 | A | 2/2005 | |
| CN | 200969385 | Y | 10/2007 | |
| CN | 201096873 | Y | 8/2008 | |
| CN | 101478607 | A | 7/2009 | |
| JP | 11185829 | A | 7/1999 | |
| JP | 2002125327 | A | 4/2002 | |
| KR | 100298344 | B1 * | 5/2001 | H04Q 1/18 |
| WO | 2008096771 | A1 | 8/2008 | |

OTHER PUBLICATIONS

English Translation of the Written Opinion of the International Search Authority in international application No. PCT/CN2009/075766, mailed on May 20, 2010.

Supplementary European Search Report in European application No. 09848209.4, mailed on Oct. 28, 2013. (10 pages—see entire document).

* cited by examiner

DETECTING CIRCUIT FOR ELECTRIC QUANTITY, PROCESSING DEVICE AND METHOD FOR STATE DETECTION OF MOBILE TELEPHONE IN STANDBY

TECHNICAL FIELD

The present disclosure relates to the filed of mobile communication devices, in particular to a detecting circuit for electric quantity, a processing device and a processing method for state detection of a mobile telephone in standby.

BACKGROUND

At present, the standby time is increasingly becoming a bottleneck of the mobile telephone due to complex and various functions of the smart mobile terminal products, and, in addition to increasing the battery capacity, an improving idea of reducing the standby current of the whole machine is an effective method for the mobile terminal manufacturers to improve the short standby time and enhance the battery endurance capability. The general mobile telephone in standby need to regularly wake up a mobile terminal to exchange with a base station and detect the state thereof (for example, battery electric quantity and battery temperature), however, the standby performance of the whole machine is greatly influenced because the current during the exchange and detection is greatly increased compared with the current during standby. Currently, state detecting of the smart mobile telephone in standby is performed by using the single wakeup mechanism as same as that for the general mobile telephone, so that the time of exiting from standby mode cannot be effectively reduced, and no other effective technical solutions are available to improve the standby time of the mobile telephone.

SUMMARY

In order to solve the technical problem, the present disclosure provides an electric quantity detecting circuit, a processing device and a processing method for detecting a state of a mobile telephone in standby.

The present disclosure provides an electric quantity detecting circuit which includes: a battery, a voltage comparator, a first resistor, a second resistor and a third resistor, wherein an anode of the battery is connected with an Analog-to-Digital Converter (ADC) of an Application Processor (AP) module, and a cathode of the battery is connected with the first, second and third resistors in series and then grounded; and the voltage comparator is connected with the cathode of the battery and configured to determine an upper electric quantity limit and a lower electric quantity limit according to the resistance values of the first, second and third resistors and detect whether the battery electric quantity is low according to the upper electric quantity limit and the lower electric quantity limit.

The voltage comparator may comprise an input terminal and a comparing unit, wherein the input terminal is configured to input the upper electric quantity limit between the first and second resistors, and input the lower electric quantity limit between the second and third resistors, the upper electric quantity limit is $1.240\times(R1+R2+R3)/(R2+R3)$, and the lower electric quantity limit is $1.240\times(R1+R2+R3)/R3$, wherein R1, R2 and R3 are the resistance values of the first, second and third resistors, respectively; and the comparing unit is configured to determine that the electric quantity is low when the battery electric quantity is determined to be in the range between the upper electric quantity limit and the lower electric quantity limit, and determine that the electric quantity is high when the battery electric quantity is determined to be out of the range between the upper electric quantity limit and the lower electric quantity limit.

The comparing unit may be further configured to send an interrupt signal through an output terminal when the electric quantity is low; and the voltage comparator may further comprise the output terminal which is connected with the Interrupt Interface (INT) of the AP module and configured to transmit the interrupt signal from the comparing unit.

A processing device for state detection of a mobile telephone in standby, which comprises the electric quantity detecting circuit for detecting state of a mobile telephone in standby, the device comprises: an Application Processor (AP) module, a wireless Modem module and the electric quantity detecting circuit, wherein the electric quantity detecting circuit is connected with an Interrupt Interface (INT) of the AP module and configured to send an interrupt signal;

the AP module is connected with the Modem module through a data interface and used, after receiving the interrupt signal, for determining that a battery electric quantity is low according to the interrupt signal; and send a command to the Modem module when the battery electric quantity is high, and determine a work state of the Modem module according to a response of the Modem module to the command; and determine a wakeup subsequent flow according to the battery electric quantity of the mobile telephone and the work state of the Modem module; and the Modem module is configured to respond to the command from the AP module when the Modem module is in a working state.

The AP module may be further configured to determine the wakeup subsequent flow according to the battery electric quantity of the mobile telephone and the work state of the Modem module, when the battery electric quantity of the mobile telephone is determined to be low, the AP module is configured to determine that the wakeup the subsequent flow is regularly detecting the state of the mobile telephone, and when the battery electric quantity of the mobile telephone is determined to be high and the Modem module is determined to be in the working state, the AP module is configured to determine that the wakeup subsequent flow is regularly exchanging with a base station and detecting the state of the mobile telephone, and when the battery electric quantity of the mobile telephone is determined to be high and the Modem module is determined to be not in the working state, the AP module is configured to determine that the wakeup subsequent flow is regularly detecting the state of the mobile telephone.

A processing method for detecting state of a mobile telephone in standby comprises the following steps:

determining whether a battery electric quantity of the mobile telephone in standby is high or low according to an electric quantity detecting circuit;

determining a work state of a Modem module when the battery electric quantity of the mobile telephone is high; and determining a wakeup subsequent flow according to whether the battery electric quantity of the mobile telephone is determined to be high or low and the determined work state of the Modem module.

The step of determining whether the battery electric quantity of the mobile telephone is high or low may comprise:

connecting an anode of the battery with an Analog-to-Digital Converter (ADC) of an Application Processor (AP) module, and connecting a cathode of the battery with a first resistor, a second resistor and a third resistor and grounding the cathode; and connecting a voltage comparator with the cathode of the battery and with the Interrupt Interface (INT) of the AP module, determining an upper electric quantity limit and a lower electric quantity limit according to the resistance values of the first, second and third resistors and detecting whether the electric quantity is low according to the upper electric quantity limit and the lower electric quantity limit.

The step of determining the upper electric quantity limit and the lower electric quantity limit according to the resistance values of the first, second and third resistors and detecting whether the electric quantity is low according to the upper electric quantity limit and the lower electric quantity limit may comprise:

inputting the upper electric quantity limit to the voltage comparator between the first and second resistors, and the lower electric quantity limit to the voltage comparator between the second and third resistors, the upper electric quantity limit is $1.240\times(R1+R2+R3)/(R2+R3)$, and the lower electric quantity limit is $1.240\times(R1+R2+R3)/R3$, wherein R1, R2 and R3 are the resistance values of the first, second and third resistors, respectively; and determining that the electric quantity is low when the battery electric quantity is determined to be in the range between the upper electric quantity limit and the lower electric quantity limit, and determining that the electric quantity is high when the battery electric quantity is determined to be out of the range between the upper electric quantity limit and the lower electric quantity limit.

The step of determining whether the battery electric quantity of the mobile telephone is high or low may comprise:

sending an interrupt signal to the AP module when the voltage comparator determines that the electric quantity is low; and determining that the battery electric quantity is low after the AP module receives the interrupt signal.

The step of determining the wakeup subsequent flow according to the battery electric quantity of the mobile telephone and the work state of the Modem module may comprise:

determining that the wakeup subsequent flow is regularly detecting the state of the mobile telephone when the battery electric quantity of the mobile telephone is determined to be low;

determining that the wakeup subsequent flow is regularly exchanging with a base station and detecting the state of the mobile telephone when the battery electric quantity of the mobile telephone is determined to be high and the Modem module is determined to be in a working state; and determining that the wakeup subsequent flow is regularly detecting the state of the mobile telephone when the battery electric quantity of the mobile telephone is determined to be high and the Modem module is determined to be not in the working state.

The step of regularly detecting the state of the mobile telephone may comprise: regularly detecting the battery electric quantity and a battery temperature.

The beneficial effects of the present disclosure are as follows.

The present disclosure provides an electric quantity detecting circuit capable of detecting whether the electric quantity of a mobile telephone is high or low, so as to possibly determine the battery electric quantity of the mobile telephone on various application occasions.

Furthermore, the present disclosure further provides a processing device comprising the electric quantity detecting circuit and a processing method for detecting the state of a mobile telephone in standby, capable of identifying the architecture mode of the mobile telephone system, so as to possibly make applications on various occasions according to the system architecture mode.

Furthermore, the present disclosure further determines a flow after wakeup according to the architecture of the system and the battery electric quantity, so as to adopt different wakeup mechanisms according to different work modes and implement the exchange between the mobile telephone and a base station and the state detection of the mobile telephone, so that the problem of standby current increase caused by the single wakeup solution is avoided, thereby increasing the standby time and enhancing the battery endurance capability; and meanwhile, adoption of hardware detection for the case of low electric quantity state can guarantee that a low electric quantity warning and shutdown information can be outputted in the low electric quantity state without automatic shutdown to reduce poor user experience.

DETAILED DESCRIPTION

Figure 1:
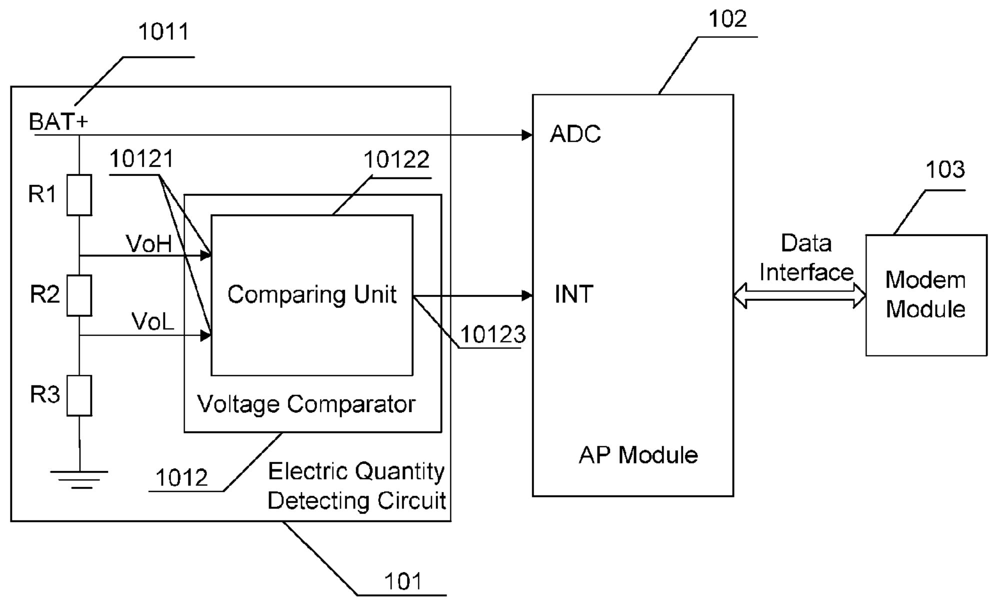
FIG. 1 is a diagram illustrating the structure of a processing device for detecting state of a mobile telephone in standby according to embodiments of the present disclosure.

In the related technologies, a general mobile telephone in standby need to regularly wake up a mobile terminal to implement exchange with a base station and state detection of the mobile telephone, however, the standby performance of the whole machine is greatly influenced because the current during the exchange and detection is greatly increased compared with the current during standby.

But, due to the inherent characteristics thereof, the current general mobile telephone in standby will regularly exit from the standby mode to implement the exchange communication between the radio frequency and a base station and implement detection of the battery electric quantity and a battery temperature during the time interval. In this case, since the exchange with the base station and the state detection are performed in the inherent state, which is complied with the requirements of general mobile terminals, there is no influence on the standby current. However, at present, most smart mobile telephones use the system architecture of an Application Processor (AP) plus a wireless module (Modem), so the smart mobile telephones have different work modes, for example, the AP is working or both the AP and the wireless module are working. Since different exchanges and detections are required in different work mode, therefore when the wakeup solution of regularly exiting from the exchange when the Modem of the general mobile terminal is working is used, the exchange between the radio frequency and the base station is not required only when the AP is working, and the monitoring of battery temperature can also be optimized. When the frequent wakeup mechanism consistent with the general mobile terminals is used, the standby current will be increased, result in reducing the standby time.

Therefore, aiming at such a characteristic of smart mobile telephone, embodiments of the present disclosure provide a solution that a smart mobile telephone use different wakeup mechanisms in different work modes to implement exchange with between the mobile telephone and a base station and detection of the state of the mobile telephone (for example, battery electric quantity and battery temperature), thereby reducing the standby current of the smart mobile telephone, and effectively improving the standby time and enhancing the battery endurance capability without changing the battery capacity.

Specifically, the present disclosure uses different wakeup mechanisms in different work modes to implement the exchange between a mobile telephone and a base station and the state detection of the mobile telephone (for example, battery electric quantity and battery temperature), thereby reducing the standby current and increasing the standby time. Currently, the general smart mobile telephone has two work modes: the AP is working, and both the AP and the Modem are working. In these two cases, it is feasible to use different wakeup mechanisms of the mobile telephones according to the characteristics of different work modes, and, meanwhile, use different methods to implement the exchange between a mobile telephone and a base station and the state detection, so as to improve the standby current. The architecture mode of the mobile telephone and the corresponding thoughts for the implementation are explained below.

At present, the architecture of most smart mobile telephones is the solution of AP plus Modem with multiple different work modes, such as the AP is working and both the AP and the Modem are working.

When only the AP is working, in the functions such as Personal Digital Assistant (PDA) of the smart mobile telephone, there is no burst wakeup between the radio frequency and the base station and no exchange with the base station is required, therefore only regularly state detection of the mobile telephone is required, for example, battery electric quantity and battery temperature. In light of this, it is possible to avoid the current caused by frequently exiting from the standby mode by prolonging the wakeup time during implementation, thereby reducing the standby current. On the other hand, the state detection of the mobile telephone (for example, battery electric quantity and battery temperature) are not required to be performed in real time, so that during the implementation, it is well feasible to prolong the detection time (10 min) prior to the detection, even without detection, in order to perform the wakeup operation as few as possible, reduce the time of exiting from standby mode during the standby, reduce the standby current, and increase the standby time.

When both the AP and the Modem are working, the Modem needs to exchange with the base station due to inherent communication between the radio frequency and the base station when it is working, and also needs to detect the state of mobile telephones (for example, battery electric quantity and battery temperature). In view of this, the wakeup mechanism as same as that of the general mobile terminal can be used for the regular wakeup according to the protocol requirement, to implement the exchange between the radio frequency and the base station, and detect the state of the mobile telephone (for example, battery electric quantity and battery temperature) during the time interval of the exchange, without increasing the wakeup number of times and the standby current in such case.

In the implementation of the present disclosure, the electric quantity of the mobile telephone is further proposed as one of the foundations for processing, as explained below.

When the battery electric quantity is low, the mobile telephone is easy to enter the shutdown state, so the state detection of the mobile telephone (for example, battery electric quantity and battery temperature) needs to change into a solution of real-time acquisition to avoid a sudden power-off shutdown during use and notify the user of information, such as low electric quantity and shutdown, in time. Specifically, the embodiments of the present disclosure also provide corresponding technical solutions, that is, using a hardware comparator to detect the battery electric quantity and send an interrupt signal to the AP through the INT, so as to detect the battery electric quantity in real time and prompt information such as low electric quantity and shutdown, thereby optimizing the user experience.

To sum up, the embodiments of the present disclosure implement the exchange between a mobile telephone and a base station and the state detection of the mobile telephone in various circumstances by using the technical solutions of three different wakeup mechanisms in three different work states to avoid the increase of standby current caused by the single way. This solution can optimize the standby current according to the characteristics of different states to reduce the standby current and enhance the battery endurance capability.

Specifically, the embodiments of the present disclosure provide an electric quantity detecting circuit configured to determine whether the battery electric quantity of a mobile telephone is high or low and use the result as one of the processing foundations after the mobile telephone is waken up to exit from standby mode; and the embodiments of the present disclosure further provide a processing device comprising the electric quantity detecting circuit for detecting the state of a mobile telephone in standby to process the flow of detecting the state of the mobile telephone in standby, thereby increasing the standby time.

Accordingly, based on the same inventive concept, the embodiments of the present disclosure further provide a processing method for detecting the state of a mobile telephone in standby to process the flow of detecting the state of the mobile telephone in standby, thereby increasing the standby time of the mobile telephone.

The embodiments of the present disclosure are explained below with reference to the drawings.

FIG. 1 is a diagram illustrating the structure of a processing device for detecting the state of a mobile telephone in standby. As shown in the figure, the device comprises an electric quantity detecting circuit 101, an Application Processor (AP) module 102 and a Modem module 103. The implementations of the electric quantity detecting circuit and the processing device are explained below in sequence.

As shown in the figure, the electric quantity detecting circuit 101 may comprise:

a battery 1011 with an anode connected with the Analog-to-Digital Converter (ADC) of the AP module and a cathode connected with a first resistor R1, a second resistor R2 and a third resistor R3 and grounded; and a voltage comparator 1012 connected with the cathode of the battery and configured to determine an upper electric quantity limit and a lower electric quantity limit according to the resistance values of the first resistor R1, the second resistor R2 and the third resistor R3 and detect whether the battery electric quantity is low according to the upper electric quantity limit and the lower electric quantity limits.

In the implementation, the voltage comparator 1012 may comprise:

an input terminal 10121 configured to input the upper electric quantity limit between the first resistor R1 and the second resistor R2 and input the lower electric quantity limit between the second resistor R2 and the third resistor R3, the upper electric quantity limit being 1.240×(R1+R2+R3)/(R2+R3) and the lower electric quantity limit being 1.240×(R1+R2+R3)/R3;

the structure relationship of the input terminal is: the input terminal 10121 is located between the first resistor R1 and the second resistor R2 and inputs the upper electric quantity limit thereto, and is located between the second resistor R2 and the third resistor R3 and input the lower electric quantity limit thereto; and a comparing unit 10122 configured to determine that the electric quantity is low when the battery electric quantity is determined to be in the range between the upper electric quantity limit and the lower electric quantity limit and determine that the electric quantity is high when the battery electric quantity is determined to be out of the range between the upper electric quantity limit and the lower electric quantity limit.

In the implementation, the comparing unit may be further configured to send an interrupt signal through an output terminal when the electric quantity is low; and the voltage comparator may further comprise:

an output terminal 10123 connected with the Interrupt Interface (INT) of the AP module and configured to transmit the interrupt signal from the comparing unit.

In the specific implementation, the voltage comparator can be realized by using a precise voltage comparator, so that the interrupt signal indicating low battery electric quantity is sent through the INT by a low voltage detecting circuit consisting of R1, R2, R3 and the precise voltage comparator, in order to detect whether the mobile telephone is in the state of low electric quantity. In the figure, VoH represents the upper limit of low electric quantity, and VoL represents the lower limit of low electric quantity, so that a range of low battery electric quantity can be determined by the resistance values of R1, R2 and R3 and the calculation formulas provided by the voltage comparator as follows:

$$VoL=1.240(R1+R2+R3)/(R2+R3); \text{ and}$$

$$VoH=1.240(R1+R2+R3)/R3.$$

In the implementation, the range of low battery electric quantity, i.e. the values of VoL and VoH, can be determined by hardware. For example, when the electric quantity of BAT+ (battery) is in the range of VoL to VoH (for example, provided that the values of R1, R2 and R3 are 121 Kohm, 1.8 Kohm, 68 Kohm, respectively, the VoL is 3.40, and the VoH is 3.49V, so, when the BAT+ is 3.30V to 3.49V, the battery is in the state of low electric quantity), the precise voltage comparator D1 outputs a low level interrupt signal through the INT in order to trigger the AP module to start a processing program for detecting the state of the mobile telephone in low electric quantity.

In the implementation, the processing device comprising the electric quantity detecting circuit 101 for detecting the state of the mobile telephone in standby may further comprise: the AP module 102 and the Modem module 103. As shown in the figure, the structure relationship is as follows:

the electric quantity detecting circuit 101 is connected with the INT of the AP module and configured to send an interrupt signal;

the AP module 102 is connected with the Modem module through a data interface and used, after receiving the interrupt signal, and is configured to determine that the battery electric quantity is low according to the interrupt signal; and send a command to the Modem module when the battery electric quantity is high, and determining a work state of the Modem module according to a response of the Modem module to the command; and determine a wakeup subsequent flow according to the battery electric quantity of the mobile telephone and the work state of the Modem module; and the Modem module 103 is configured, when in a working state, to respond to the command from the AP module.

In the specific implementation, the processing device configured to detect the state of the mobile telephone in standby mainly consists of a low electric quantity detecting circuit, an AP module and a Modem module. The low electric quantity detecting circuit is connected with the AP module through an ADC converting interface and an interrupt interface, and the Modem module is connected with the AP module through a data interface. Compared with the hardware of a normal smart mobile telephone, mainly the low electric quantity detecting circuit is additionally provided. The battery (BAT+) is connected with the Analog-to-Digital Converting interface (ADC) of the AP module and configured to detect the battery electric quantity of the mobile telephone in the normal circumstance to obtain a value of the battery electric quantity by regularly waking up the AP module.

Between the Modem and the AP, whether the Modem is started can be determined through the data interface. For example, the AP module sends a READY command to the Modem module, when the Modem module returns an OK command, it is indicated that the Modem module is started, thus the wakeup mechanism for the case when the Modem module is started can be executed. When the Modem module does not return the OK command, it is indicated that the Modem module is not started, so the program executes the wakeup mechanism for the case when the Modem module is not started. Therefore, three states can be divided by determining whether the electric quantity is low and whether the Modem module is started, and three different wakeup mechanisms can be adopted, so that the standby current can be reduced.

Specifically, the AP module is further used, when determining a wakeup subsequent flow according to the battery electric quantity of the mobile telephone and the work state of the Modem module and when the battery electric quantity of the mobile telephone is determined to be low, for determining that the wakeup subsequent flow is regularly detecting the state of the mobile telephone; when the battery electric quantity of the mobile telephone is determined to be high and the Modem module is determined to be in the working state, for determining that the wakeup subsequent flow is regularly exchanging with a base station and detecting the state of the mobile telephone; and when the battery electric quantity of the mobile telephone is determined to be high and the Modem module is determined to be not in the working state, for determining that the wakeup subsequent flow is regularly detecting the state of the mobile telephone.

In the implementation, regularly detecting the state of the mobile telephone may comprise regularly detecting the battery electric quantity and a battery temperature.

Based on the same inventive concept, the embodiments of the present disclosure further provide a processing method for detecting state of a mobile telephone in standby with the principle of solving problems similar to that of the processing device for detecting the state of a mobile telephone in standby, so that, for the implementation of the method, the reference is given in the implementation of the processing device without describing the repetition.

Figure 2:
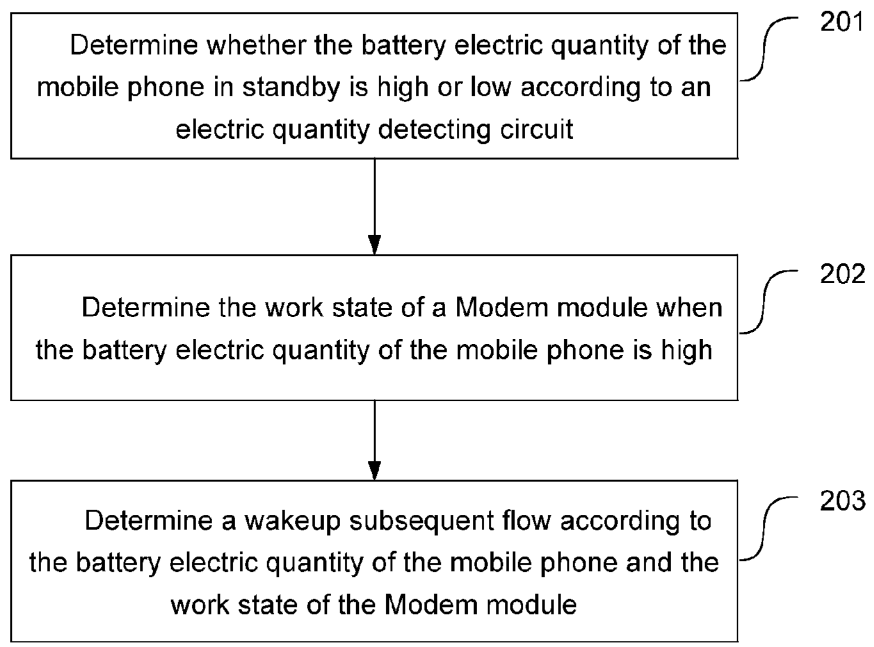
FIG. 2 is a flowchart illustrating the implementation of a processing method for detecting state of a mobile telephone in standby according to embodiments of the present disclosure.

FIG. 2 is a flowchart illustrating the implementation of a processing method for detecting state of a mobile telephone in standby. As shown in the figure, the processing method may comprise the following steps:

Step 201, determining whether a battery electric quantity of the mobile telephone is high or low according to an electric quantity detecting circuit when the mobile telephone is in standby;

Step 202, determining a work state of a Modem module when the battery electric quantity of the mobile telephone is high; and Step 203, determining a wakeup subsequent flow according to whether the battery electric quantity of the mobile telephone is high or low and the work state of the Modem module.

In the implementation, determinating whether the battery electric quantity of a mobile telephone is high or low may comprise:

connecting an anode of the battery with an Analog-to-Digital Converter (ADC) of an Application Processor (AP) module, and connecting a cathode of the battery with a first resistor, a second resistor and a third resistor and grounding the cathode; and connecting a voltage comparator with the cathode of the battery and with the Interrupt Interface (INT) of the AP module, determining an upper electric quantity limit and a lower electric quantity limit according to the resistance values of the first, second and third resistors and detecting whether the electric quantity is low according to the upper electric quantity limit and the lower electric quantity limit.

In the implementation, determining the upper electric quantity limit and the lower electric quantity limit according to the resistances of the first, second and third resistors and detecting whether the battery electric quantity is low according to the upper electric quantity limit and the lower electric quantity limit may comprise:

inputting the upper electric quantity limit to the voltage comparator between the first and second resistors and the lower electric quantity limit to the voltage comparator between the second and third resistors, the upper electric quantity limit being $1.240\times(R1+R2+R3)/(R2+R3)$, and the lower electric quantity limit being $1.240\times(R1+R2+R3)/R3$; and determining that the electric quantity is low when the battery electric quantity is determined to be in the range between the upper electric quantity limit and the lower electric quantity limit and determining that the electric quantity is high when the battery electric quantity is determined to be out of the range between the upper electric quantity limit and the lower electric quantity limit.

In the implementation, determining whether the battery electric quantity of a mobile telephone is high or low may comprise:

sending an interrupt signal to the AP module when the voltage comparator determines that the electric quantity is low; and determining that the battery electric quantity is low after the AP module receives the interrupt signal.

In the implementation, determining the wakeup subsequent flow according to the battery electric quantity of the mobile telephone and the work state of the Modem module may comprise:

determining that the wakeup subsequent flow is regularly detecting the state of the mobile telephone when the battery electric quantity of the mobile telephone is determined to be low;

determining that the wakeup subsequent flow is regularly exchanging with a base station and detecting the state of the mobile telephone when the battery electric quantity of the mobile telephone is determined to be high and the Modem module is determined to be in a working state; and determining that the wakeup subsequent flow is regularly detecting the state of the mobile telephone when the battery electric quantity of the mobile telephone is determined to be high and the Modem module is determined to be not in the working state.

In the implementation, regularly detecting the state of the mobile telephone may comprise regularly detecting the battery electric quantity and a battery temperature.

For the better explanation of the technical solutions in the embodiments of the present disclosure, the following example is provided for the explanation.

Figure 3:
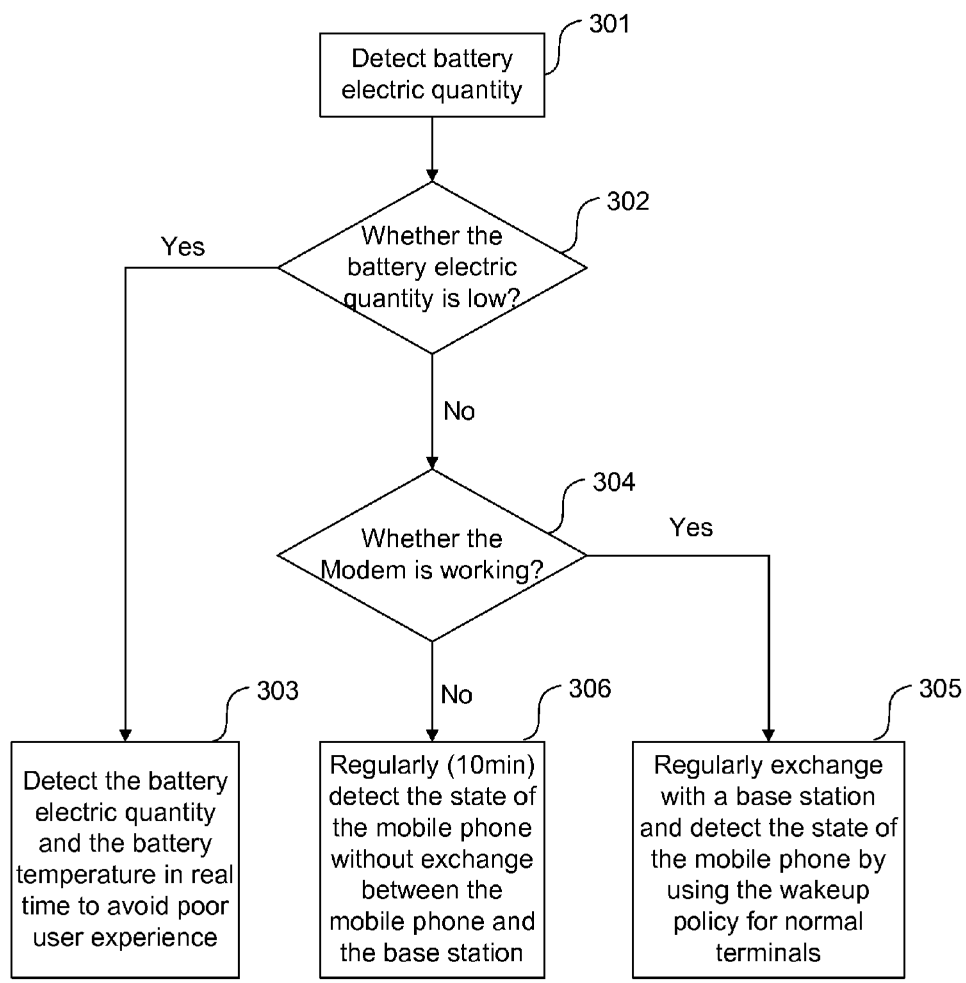
FIG. 3 is a flowchart illustrating the implementation for the processing of detecting the state of the mobile telephone in standby according to embodiments of the present disclosure.

FIG. 3 is a flowchart illustrating the implementation for the processing of detecting the state of a mobile telephone in standby. As shown in the figure, the processing may comprise the following steps:

Step 301, detecting the battery electric quantity;

Step 302, determining whether the electric quantity is low, when it is, go to Step 303, otherwise, go to Step 304, wherein in the specific implementation, when the battery electric quantity is low, an interrupt signal can be sent to the AP module, so that the AP module knows the state of whether the electric quantity is high or low;

Step 303, detecting the electric quantity and the temperature in real time to avoid poor user experience and the processing is over;

Step 304, determining whether the Modem module is working, when it is, go to Step 305, otherwise, go to Step 306;

Step 305, adopting the wakeup policy for a normal terminal of regularly exchanging with a base station and detecting the state of the mobile telephone; and Step 306, regularly (for example, 10 min) detecting the state of the mobile telephone without exchanging with the base station by the mobile telephone, and In the implementation above, after the start-up, Step 301 is executed to start detecting the battery electric quantity; whether the state is low electric quantity is determined in Step 302, when it is, the wakeup mechanism of regularly detecting the state of the mobile telephone (for example, battery electric quantity and battery temperature) in real time in Step 303 is used, and when the electric quantity is low, a hardware circuit generates an interrupt signal through which prompting information of low electric quantity or shutdown is sent in real time to optimize the user experience, and when it is not, the operation in Step 304 is executed.

In Step 304, the AP module can send a READY command through a data interface, and when the Modem module returns an OK command, it can be determined that the Modem module is in the started work state, and at this time, the wakeup mechanism for normal terminals in Step 305 can be used. This solution will regularly wake up and exit from the standby state to implement the exchange between the mobile telephone and a base station and detect the state of the mobile telephone (for example, battery electric quantity and battery temperature) during the burst interval time of the exchange, in which the standby current is guaranteed to be consistent with the electric consumption of the normal terminals. When the Modem module is not started, the operation in Step 306 is executed.

When the AP module sends the READY command through the data interface, and the Modem module does not return the OK command, it can be determined that the Modem module is not started, i.e. not in a working state, at this time, the wakeup mechanism of without exchanging with the base station by the mobile telephone in Step 306 can be used, and only the state detection of the mobile telephone is required in the implementation. It is feasible to prolong the interval of detecting the state of the mobile telephone, for example, the state of the mobile telephone (for example, battery electric quantity and battery temperature) is detected once every 10 min or so, or not detected in such a state. In comparison with the frequency of the wakeup mechanism for normal terminals that needs to wake up once every dozens of milliseconds, the wakeup number of times can be greatly reduced, thereby reducing the current consumption and increasing the standby time.

From the embodiment above, it can be seen that the technical solutions provided by the embodiments of the present disclosure can adopt different wakeup mechanisms according to different work modes and implement the exchange between the mobile telephone and a base station and the state detection of the mobile telephone, so that the problem of standby current increase caused by the single wakeup solution is avoided, thereby increasing the standby time and enhancing the battery endurance capability; and meanwhile, adoption of hardware detection for the case of low electric quantity state can guarantee that a low electric quantity warning and shutdown information can be outputted in the low electric quantity state without automatic shutdown to reduce poor user experience.

Those skilled in the art should understand that the embodiments of the present disclosure can be provided as a method, a system or a computer program product. Therefore, the present disclosure can be in the form of complete hardware embodiment, complete software embodiment or hardware and software combined embodiment. Moreover, the present disclosure can be in the form of a computer program product implemented on one or more computer available memory media (including, but not limited to, disk memory, CD-ROM and optical memory) comprising computer available program codes.

The present disclosure is described with reference to the flowchart and/or block diagram of the method, device (system) and computer program product according to the embodiments thereof. It should be understood that every flow and/or block in the flowchart and/or block diagram, and the combination of flow and/or block in the flowchart and/or block diagram can be implemented by the computer program instructions. Such computer program instructions can be provided to processors of a general computer, a dedicated computer, an embedded processing unit or other programmable data processing devices to produce a machine, so that the processor of the computer or other programmable data processing devices executes the instructions, so as to produce an apparatus used for implementing the functions specified in one or more flows in the flowchart and/or one or more blocks in the block diagram.

These computer program instructions can also be stored in a computer readable memories capable of booting the computer or other programmable data processing devices to function in specified modes, so that the instructions stored in the computer readable memories generate a product having an instruction apparatus which implements the functions specified in one or more flows in the flowchart and/or one or more blocks in the block diagram.

These computer program instructions can also be loaded in the computer or other programmable data processing devices to execute a series of operating steps thereon and generate a processing realized by the computer, so that the instructions executed on the computer or other programmable data processing devices provide the steps for implementing the functions specified in one or more flows in the flowchart and/or one or more blocks in the block diagram.

Although the preferred embodiments of the present disclosure have been described, other alterations and modifications can be made to these embodiments by those skilled in the art finding the basic creative concepts. Therefore, the appended claims are intended to be explained as including the preferred embodiments and all alterations and modifications falling within the scope of the present disclosure.

Obviously, any modifications and variations for the present disclosure can be made by those skilled in the art without departing from the spirit and scope of the present disclosure. By doing so, when such modifications and variations of the present disclosure are in the scope of the claims and its equivalent technologies, the present disclosure is intended to include these modifications and variations.

What is claimed is:

1. An electric quantity detecting circuit, comprising: a battery, a voltage comparator, a first resistor, a second resistor and a third resistor, wherein an anode of the battery is connected with an Analog-to-Digital Converter (ADC) of an Application Processor (AP) module, and a cathode of the battery is series connected with the first, second and third resistors in series and then grounded; and the voltage comparator is connected with the cathode of the battery and configured to determine an upper electric quantity limit and a lower electric quantity limit according to the resistance values of the first, second and third resistors and detect whether the battery electric quantity is low according to the upper electric quantity limit and the lower electric quantity limit;

wherein the voltage comparator comprises an input terminal and a comparing unit, wherein the input terminal is configured to input the upper electric quantity limit between the first and second resistors, and input the lower electric quantity limit between the second and third resistors, the upper electric quantity limit is $1.240\times(R1+R2+R3)/(R2+R3)$, and the lower electric quantity limit is $1.240\times(R1+R2+R3)/R3$, wherein R1, R2 and R3 are resistance values of the first, second and third resistors, respectively; and the comparing unit is configured to determine that the electric quantity is low when the batter electric quantity is determined to be in the ran se between the upper electric quantity limit and the lower electric quantity limit, and determine that the electric quantity is high when the battery electric quantity is determined to be out of the range between the upper electric quantity limit and the lower electric quantity limit.

2. The electric quantity detecting circuit according to claim 1, wherein the comparing unit is further configured to send an interrupt signal through an output terminal when the electric quantity is low; and the voltage comparator further comprises the output terminal which is connected with the Interrupt Interface (INT) of the AP module and configured to transmit the interrupt signal from the comparing unit.

3. A processing device for state detection of a mobile telephone in standby, which comprises the electric quantity detecting circuit according to claim 1, the device comprising:

an Application Processor (AP) module, a wireless Modem module and the electric quantity detecting circuit, wherein the electric quantity detecting circuit is connected with an Interrupt Interface (INT) of the AP module and configured to send an interrupt signal;

the AP module is connected with the Modem module through a data interface and used, after receiving the interrupt signal, configured to determine that a battery electric quantity is low according to the interrupt signal; and send a command to the Modem module when the battery electric quantity is high, and determine a work state of the Modem module according to a response of the Modem module to the command; and determine a wakeup subsequent flow according to the battery electric quantity of the mobile telephone and the work state of the Modem module; and the Modem module is configured to respond to the command from the AP module when the Modem module is in a working state.

4. The device according to claim 3, wherein the AP module is further configured to determine the wakeup subsequent flow according to the battery electric quantity of the mobile telephone and the work state of the Modem module; when the battery electric quantity of the mobile telephone is determined to be low, the AP module is configured to determine that the wakeup subsequent flow is regularly detecting the state of the mobile telephone, and when the battery electric quantity of the mobile telephone is determined to be high and the Modem module is determined to be in the working state, the AP module is configured to determine that the wakeup subsequent flow is regularly exchanging with a base station and detect the state of the mobile telephone, and when the battery electric quantity of the mobile telephone is determined to be high and the Modem module is determined to be not in the working state, the AP module is configured to determine that the wakeup subsequent flow is regularly detecting the state of the mobile telephone.

5. A processing method for state detection of a mobile telephone in standby, comprising the following steps:

determining whether a battery electric quantity of the mobile telephone in standby is high or low according to an electric quantity detecting circuit;

determining a work state of a Modem module when the battery electric quantity of the mobile telephone is high; and determining a wakeup subsequent flow according to the determined battery electric quantity of the mobile telephone and the determined work state of the Modem module;

wherein the step of determining whether the battery electric quantity of the mobile telephone is high or low comprises:

connecting an anode of the batter with an Analog-to-Digital Converter (ADC) of an Application Processor (AP) module, and series connecting a cathode of the battery with a first resistor, a second resistor and a third resistor and grounding the cathode; and connecting a voltage comparator or with the cathode of the batter and with an Interrupt Interface (INT) of the AP module, determining an upper electric quantity limit and a lower electric quantity limit according to the resistance values of the first second and third resistors and detecting whether the battery electric quantity is low according to the upper electric limit and the lower electric quantity limit;

wherein the step of determining the upper electric quantity and the lower electric quantity limit according to the resistance values of the first, second and third resistors and detecting whether the batter electric quantity is low according to the upper electric quantity limit and the lower electric quantity limit comprises:

inputting the upper electric quantity limit to the voltage comparator between the first and second resistors, and the lower electric limit to the voltage comparator between the second and third resistors, and wherein the upper electric quantity limit is $1.240\times(R\mathbf{1}+R\mathbf{2}+R\mathbf{3})/(R\mathbf{2}+R\mathbf{3})$, and the lower electric quantity limit is $1.240\times(R\mathbf{1}+R\mathbf{2}+R\mathbf{3})/R\mathbf{3}$, wherein R1, R2 and R3 are resistance values of the first, second and third resistors, respectively; and determining that the electric quantity is low when the battery electric quantity is determined to be in the ran se between the upper electric quantity limit and the lower electric quantity limit, and determining that the electric quantity is high when the battery electric quantity is determined to be out of the range between the upper electric quantity limit and the lower electric quantity limit.

6. The method according to claim 5, wherein the step of determining whether the battery electric quantity of the mobile telephone is high or low comprises:

sending an interrupt signal to the AP module when the voltage comparator determines that the electric quantity is low; and determining that the battery electric quantity is low after the AP module receives the interrupt signal.

7. The method according to claim 5, wherein the step of determining the wakeup subsequent flow according to the battery electric quantity of the mobile telephone and the work state of the Modem module comprises:

determining that the wakeup subsequent flow is regularly detecting the state of the mobile telephone when the battery electric quantity of the mobile telephone is determined to be low;

determining that the wakeup subsequent flow is regularly exchanging with a base station and detecting the state of the mobile telephone when the battery electric quantity of the mobile telephone is determined to be high and the Modem module is determined to be in a working state; and determining that the wakeup subsequent flow is regularly detecting the state of the mobile telephone when the battery electric quantity of the mobile telephone is determined to be high and the Modem module is determined to be not in the working state.

8. The method according to claim 7, wherein the step of regularly detecting the state of the mobile telephone comprises: detecting the battery electric quantity and the battery temperature.

9. The method according to claim 6, wherein the step of determining the wakeup subsequent flow according to the battery electric quantity of the mobile telephone and the work state of the Modem module comprises:

determining that the wakeup subsequent flow is regularly detecting the state of the mobile telephone when the battery electric quantity of the mobile telephone is determined to be low;

determining that the wakeup subsequent flow is regularly exchanging with a base station and detecting the state of the mobile telephone when the battery electric quantity of the mobile telephone is determined to be high and the Modem module is determined to be in a working state; and determining that the wakeup subsequent flow is regularly detecting the state of the mobile telephone when the battery electric quantity of the mobile telephone is determined to be high and the Modem module is determined to be not in the working state.

10. The method according to claim 9, wherein the step of regularly detecting the state of the mobile telephone comprises: detecting the battery electric quantity and the battery temperature.

* * * * *